United States Patent
Oguzman et al.

(10) Patent No.: US 7,280,330 B2
(45) Date of Patent: Oct. 9, 2007

(54) ESD PROTECTION FOR RF POWER AMPLIFIER CIRCUITS

(75) Inventors: Ismail H. Oguzman, Plano, TX (US); Charvaka Duvvury, Plano, TX (US); Chih-Ming Hung, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 422 days.

(21) Appl. No.: 10/936,308

(22) Filed: Sep. 8, 2004

(65) Prior Publication Data

US 2006/0050452 A1    Mar. 9, 2006

(51) Int. Cl.
*H02H 9/00* (2006.01)
(52) U.S. Cl. ........................................ 361/56
(58) Field of Classification Search ................ 361/56
See application file for complete search history.

(56) References Cited

U.S. PATENT DOCUMENTS

| | | | |
|---|---|---|---|
| 6,310,379 B1 | 10/2001 | Andresen et al. | |
| 6,459,340 B1 * | 10/2002 | Apel et al. | 330/298 |
| 6,529,059 B1 * | 3/2003 | Davis | 327/310 |
| 6,535,368 B2 | 3/2003 | Andresen et al. | |
| 6,690,066 B1 | 2/2004 | Lin et al. | |
| 6,760,205 B1 * | 7/2004 | Gaboury | 361/56 |
| 6,882,512 B2 * | 4/2005 | Castillejo et al. | 361/56 |
| 7,102,865 B2 * | 9/2006 | Lu et al. | 361/56 |
| 2003/0189448 A1 * | 10/2003 | Boemler | 327/112 |
| 2006/0043490 A1 * | 3/2006 | Brauchler et al. | 257/355 |

* cited by examiner

*Primary Examiner*—Ronald W. Leja
(74) *Attorney, Agent, or Firm*—Dolly Y. Wu; W. James Brady; Frederick J. Telecky, Jr.

(57) ABSTRACT

An electrostatic discharge (ESD) device for protecting a power amplifier circuit is disclosed. The ESD device comprises a first ESD protection circuit coupled between a positive terminal of a supply voltage and a negative terminal of the supply voltage, and a second ESD protection circuit coupled between the negative terminal of the supply voltage and an output terminal of the power amplifier circuit, wherein a first current path is formed from the positive terminal to the output terminal through the first and second ESD protection circuits. A circuit device operative to increase impedance of a second current path from the positive terminal to the output terminal through the power amplifier circuit to divert current from the second current path to the first current path in the course of an ESD event.

22 Claims, 3 Drawing Sheets

US 7,280,330 B2

ESD PROTECTION FOR RF POWER AMPLIFIER CIRCUITS

TECHNICAL FIELD

This invention relates to electronic circuits, and more specifically relates to electrostatic discharge (ESD) protection of power amplifier circuits.

BACKGROUND

Electrostatic discharge (ESD) is a continuing problem in the design and manufacture of semiconductor devices. Integrated circuits (ICs) can be damaged by ESD events, in which large currents flow through the device. These ESD events can stem from a variety of sources. In one such ESD event, a packaged IC acquires a charge when it is held by a human whose body is electrostatically charged. An ESD event can occur when the IC is inserted into a socket, and one or more of the pins of the IC package touch the grounded contacts of the socket. This type of event is known as a human body model (HBM) ESD event. Another ESD event, which can be caused by metallic objects, is known as a machine model (MM) ESD event. An MM ESD event can be characterized by a greater capacitance and lower internal resistance than the HBM ESD event. A third ESD event is the charged device model (CDM). The CDM ESD event involves situations where an IC becomes charged and discharges to ground.

ESD events typically involve discharge of current between one or more pins or pads exposed to the outside of an integrated circuit chip. The direction of current flow from an ESD event results from positive or negative ESD strikes, which are determined from the polarity of voltage on the pad relative to ground or a supply voltage terminal. In either type of ESD event, positive or negative, current may flow through vulnerable circuitry in the IC that may not be designed to carry such currents. The vulnerability of IC chips to ESD strikes has created an important need for ESD protection circuits.

As a result of the need to protect IC chips from ESD strikes, ESD protection circuits are often added to the integral design of IC chips, such as RF power amplifiers. Many conventional ESD protection schemes for ICs employ peripheral dedicated circuits to carry the ESD currents from the pin or pad of the device to ground by providing a low impedance path. Thus, an output ESD cell requires low impedance for proper ESD protection. In this way, the ESD currents flow through the protection circuitry, rather than through the more susceptible circuits in the chip. However, ESD protection of RF power amplifiers has been historically difficult due to a competing requirement of low output capacitance for maximum RF power transfer.

SUMMARY

One aspect of the present invention relates to an electrostatic discharge (ESD) device for protecting a power amplifier circuit. The ESD device comprises a first ESD protection circuit coupled between a positive terminal of a supply voltage and a negative terminal of the supply voltage, and a second ESD protection circuit coupled between the negative terminal of the supply voltage and an output terminal of the power amplifier circuit, wherein a first current path is formed from the positive terminal to the output terminal through the first and second ESD protection circuits. A circuit device is provided that is operative to increase impedance of a second current path from the positive terminal to the output terminal through the power amplifier circuit to divert current from the second current path to the first current path in the course of an ESD event.

Another aspect of the invention relates to a power amplifier circuit. The power amplifier circuit comprises a power amplifier output transistor and a first electrostatic discharge (ESD) protection circuit coupled between a positive terminal of a supply voltage and a negative terminal of the supply voltage. A second ESD protection circuit is coupled to a first diode. The first diode and the second ESD protection circuit are coupled between an output terminal of the power amplifier output transistor and the negative terminal of the supply voltage to provide a first current path from the output terminal to the negative terminal. The first diode reduces the capacitance associated with the second ESD protection circuit. The power amplifier circuit also includes a second diode coupled between the output terminal and the negative terminal. The second diode provides a second current path from the negative terminal to the output terminal.

Another aspect of the invention relates to a communication device. The communication device comprises means for amplifying an input signal, a first means for providing bi-directional electrostatic discharge (ESD) protection of the means for amplifying between a positive terminal of a supply voltage and a negative terminal of the supply voltage, and a second means for providing bi-directional ESD protection of the means for amplifying between the negative terminal of the supply voltage and an output terminal of the means for amplifying. The communication device also includes means for reducing the output capacitance of the second means for providing bi-directional ESD protection, and means for increasing the impedance of a current path from the positive terminal to the output terminal through the means for amplifying to substantially limit current flow through the means for amplifying in the course of an ESD event.

DETAILED DESCRIPTION

The present invention relates to electronic circuits, and more specifically relates to electrostatic discharge (ESD) protection of power amplifier circuits. It is important to protect an output terminal of a RF power amplifier circuit against many different types of ESD stresses. Examples of different ESD stresses could include a positive or a negative ESD strike across an output terminal of the RF power amplifier circuit relative to both a positive and a negative power supply terminal associated with the RF power amplifier circuit. It is to be appreciated that the use of the term positive supply terminal implies a high rail voltage associated with a supply voltage, and the use of a negative power supply terminal implies a low rail voltage associated with a supply voltage. However, the voltage at either terminal can be positive, negative, or zero, as long as the positive supply terminal has a voltage that is higher than the negative supply terminal.

In many applications, an output ESD cell and a power supply ESD cell are coupled to the RF power amplifier and provide appropriate bi-directional protection from ESD strikes by directing current through paths away from a RF power amplifier output transistor. In certain applications, the addition of an output ESD cell adds undesirable capacitance to the power amplifier output, which, in effect, lowers RF power transfer. However, incorporating additional circuit components to the ESD output cell to reduce capacitance increases the impedance of the output ESD cell, thus reducing its effectiveness in protecting the power amplifier circuit from ESD strikes. Thus, there exists a conflict between two competing design constraints: the need for low capacitance to maximize RF power transfer versus the need for low impedance for proper functionality of the ESD protection circuitry.

Figure 1:
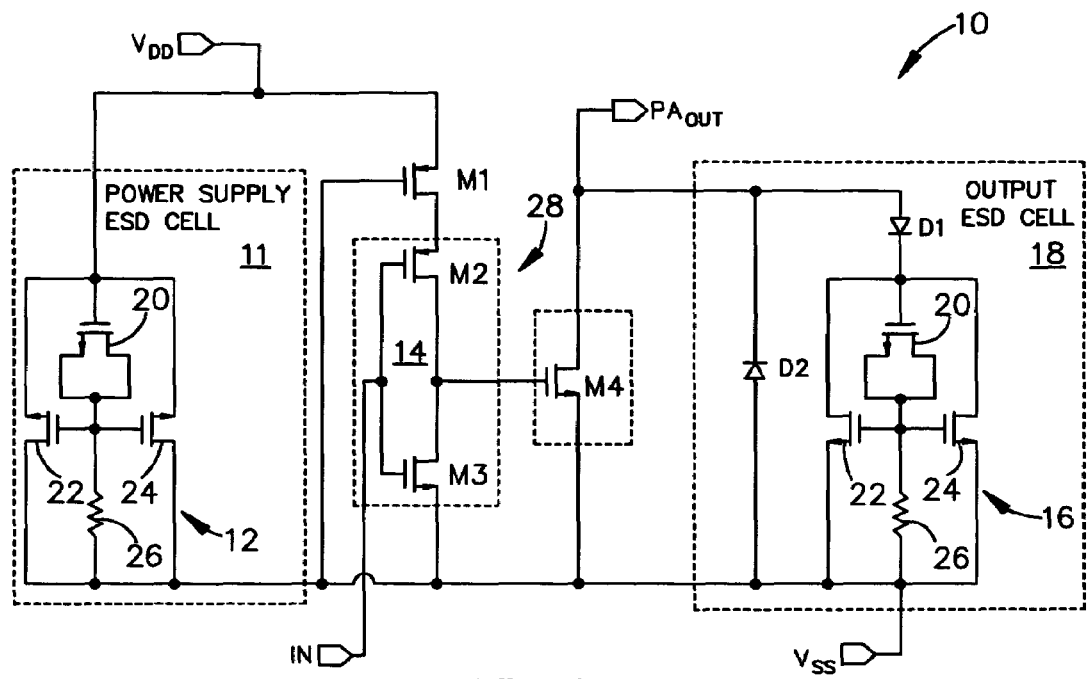
FIG. 1 illustrates a schematic diagram of a power amplifier circuit with ESD protection in accordance with an aspect of the invention.

FIG. 1 illustrates a power amplifier circuit 10 in accordance with an aspect of the invention. The power amplifier circuit 10 is an output stage of a power amplifier device and includes a power amplifier output transistor M4, a power supply ESD cell 11, an output ESD cell 18, and a drive circuit 28. The power amplifier output transistor M4, the power supply ESD cell 12, the output ESD cell 18, and the drive circuit 28 are each coupled between a positive supply voltage terminal $V_{DD}$, and a negative supply voltage terminal $V_{SS}$, as demonstrated in FIG. 1. The drive circuit 28 could be an inverter circuit 14 that receives a digital input signal (IN). The inverter circuit 14 drives a gate of the power amplifier output transistor M4, which produces an amplified RF output signal at an output terminal $PA_{OUT}$ at a drain terminal of the power amplifier output transistor M4.

Inverter circuit 14 includes a p-type metal-oxide semiconductor (PMOS) transistor M2 and an n-type metal-oxide semiconductor (NMOS) transistor M3. The digital input (IN) is connected to gate terminals of both transistor M2 and transistor M3. The output of inverter circuit 14 is the common connection of a drain terminal of transistor M2 and a drain terminal of transistor M3, which is coupled to a gate terminal of the power amplifier output transistor M4. A source terminal of transistor M3 is tied to the negative supply voltage terminal $V_{SS}$. A source terminal of transistor M2 is coupled to the positive voltage supply terminal $V_{DD}$ through a transistor M1. Transistor M1 is shown in FIG. 1 to be a (PMOS) field-effect transistor with a gate terminal connected to the negative power supply terminal $V_{SS}$, such that it operates in the normal bias condition. However, it should be noted that any type of circuit device or combination of devices could be substituted for transistor M1, such as a different kind of transistor operating in a normal bias condition, so long as the circuit device increases impedance of a current path from the positive supply voltage terminal $V_{DD}$ through the gate of the power amplifier output transistor M4 to the output terminal $PA_{OUT}$, without adversely affecting the operation of the power amplifier circuit 10.

The output ESD cell 18 includes a diode D1 that is connected in series with an ESD protection circuit 16. An anode of the diode D1 is connected to the power amplifier output terminal $PA_{OUT}$, and a cathode is connected to the ESD protection circuit 16. The other end of the ESD protection circuit 16 is coupled to the negative voltage supply terminal $V_{SS}$. A diode D2 is coupled in parallel with the series connected diode D1 and the ESD protection circuit 16, with an anode connected to the negative supply terminal $V_{SS}$ and a cathode connected to the power amplifier output terminal $PA_{OUT}$. The diode D2 is situated parallel to the output transistor M4. Collectively, diode D1, diode D2, and ESD protection circuit 16 form the output ESD cell 18.

The power supply ESD cell 11 includes an ESD protection circuit 12. As depicted in FIG. 1, the ESD protection circuits 12 and 16 include similar configurations. However, the size of the components forming the ESD protection circuit 12 are not limited by the requirements associated with the output terminal of the power amplifier, and thus can be designed to have a much lower impedance as compared to the components forming the ESD protection circuit 16. The ESD protection circuits 12 and 16 are both bi-directional ESD protection circuits that contain three NMOS transistors 20, 22, and 24, respectively. The transistor 20, which is used as a capacitor in ESD protection circuits 12 and 16, has a gate terminal that is connected to drain terminals of transistors 22 and 24. A drain and a source terminal of transistor 20 are connected to each other and also connected to gate terminals of transistors 22 and 24, which is also connected to a resistor 26. Source terminals of the transistors 22 and 24, as well as the resistor 26, are connected to the negative supply voltage terminal $V_{SS}$. It should be noted that, despite the configuration of the ESD protection circuits 12 and 16 as illustrated in FIG. 1, a variety of different ESD protection circuits could suffice in accordance with an aspect of the invention.

The power amplifier circuit 10 provides ESD protection against a variety of different types of ESD strikes on the output terminal $PA_{OUT}$ while still maintaining a relatively low capacitance at the output ESD cell 18 for maximizing RF power transfer. The diode D1 is connected in series with the ESD protection circuit 16, which lowers the capacitance of the output ESD cell 18 by placing a capacitive device in series with the ESD protection circuit 16. However, the diode D1 blocks current flow from the negative power supply terminal to the power amplifier output terminal. Therefore, the diode D2 is connected in parallel with the series connection of the diode D1 and the ESD protection circuit 16 to provide for bi-directional ESD protection capability of the output ESD cell 18. The diode D2 is selected to have a small capacitance so as not to substantially affect the capacitance of the output ESD cell.

However, the inclusion of a parallel connected diode D2 is not sufficient to create an ESD current path with a low enough impedance for current from an ESD strike to flow from the positive voltage supply terminal $V_{DD}$ to the power amplifier output terminal $PA_{OUT}$. Therefore, some current that flows from the positive voltage supply terminal $V_{DD}$ to the power amplifier output terminal $PA_{OUT}$ as a result of a negative ESD strike on the power amplifier output terminal $PA_{OUT}$ relative to the positive voltage supply terminal $V_{DD}$ is diverted through the driver circuit through the gate of the power output transistor M4. This additional current through the gate of the power output transistor can cause damage to the gate oxide of the power output transistor M4. Therefore, the transistor M1 is connected in series with the inverter circuit 14 between the positive voltage supply terminal $V_{DD}$ and the transistor M2 to increase the impedance of the current path through transistors M1, M2, and M4 to the power amplifier output terminal $PA_{OUT}$. Increasing the impedance through this current path reduces current flow through the gate of the power output transistor, in the course of a negative ESD strike on the power amplifier output terminal $PA_{OUT}$ relative to the positive voltage supply terminal $V_{DD}$, and diverts the additional current flow through the power supply ESD cell and the output ESD cell to the power amplifier output terminal $PA_{OUT}$. As a result, damage to the gate oxide of the power amplifier output transistor M4 is mitigated. The addition of these circuit components, diode D1, diode D2, and transistor M1, and the benefits they confer on the power amplifier circuit 10, will become more apparent when considering FIGS. 2-4.

Figure 2:
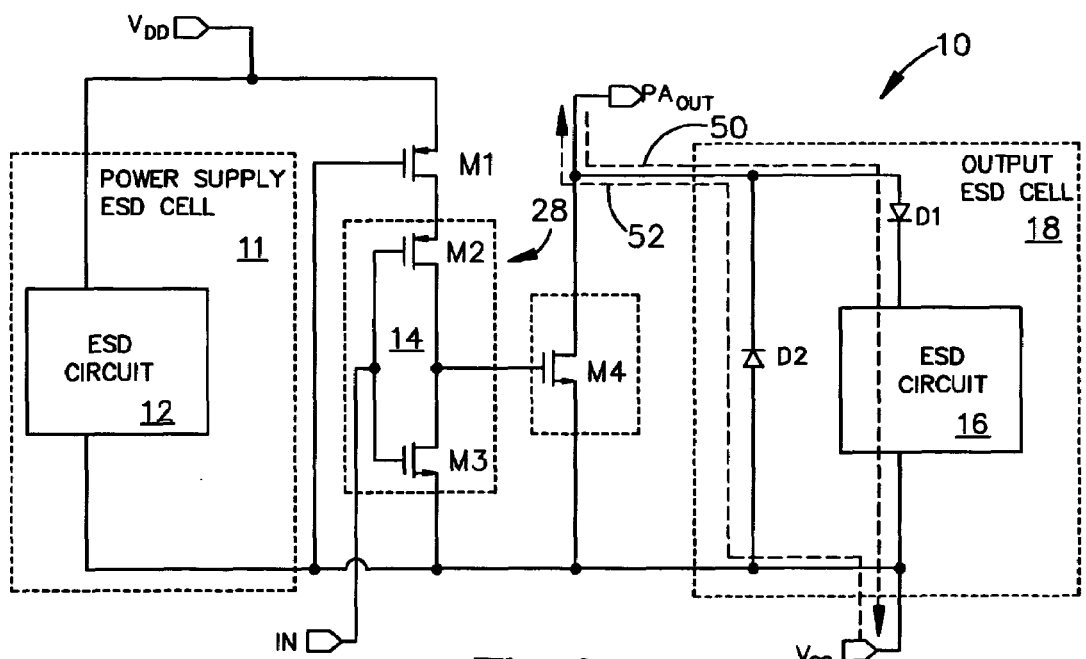
FIG. 2 illustrates a schematic diagram of a power amplifier circuit that depicts current flows associated with different ESD events in accordance with an aspect of the invention.

FIG. 2 illustrates current paths 50 and 52, which indicate the direction and path of current flow in the course of different ESD strikes on power amplifier output terminal $PA_{OUT}$. It should be noted that that ESD circuits 12 and 16 are illustrated as blocks in FIGS. 2 through 4 to demonstrate that ESD protection circuits 12 and 16 are not limited to what is shown in FIG. 1 and described above, and also for ease of demonstrating current flow.

As described above, the diode D1 is connected in series with the ESD protection circuit 16 for the purpose of lowering capacitance of the output ESD cell 18, thus maximizing RF power transfer of the power amplifier circuit 10. In the course of a positive ESD strike on the power amplifier output terminal $PA_{OUT}$ relative to the negative voltage supply terminal $V_{SS}$, the ESD protection circuit 16 operates to shunt the current to the negative voltage supply terminal $V_{SS}$, as indicated by the current path 50, thus protecting the power amplifier output transistor M4 from damage. However, the addition of the diode D1 prevents bi-directional ESD protection from the ESD protection circuit 16 because of the substantially high impedance of the cathode terminal of diode D1 in the current flow direction opposite current path 50. Effectively, diode D1 prevents current flow from the negative voltage supply terminal $V_{SS}$ to the power amplifier output terminal $PA_{OUT}$ through the ESD protection circuit 16 in the event of a negative ESD strike on the power amplifier output terminal $PA_{OUT}$ relative to the negative voltage supply terminal $V_{SS}$.

To keep output ESD cell 18 bi-directional in its ESD protection capability, the diode D2 is connected parallel to the series connection of diode D1 and the ESD protection circuit 16. As previously described, for the purpose of keeping output ESD cell 18 bi-directional in its ESD protection capability, the diode D2 is situated with a polarity opposite of diode D1 connected to the power amplifier terminal $PA_{OUT}$. Current path 52 demonstrates the direction of current flow in the course of a negative ESD strike on power amplifier output terminal $PA_{OUT}$ relative to the negative voltage supply terminal $V_{SS}$. Because the diode D1 prevents current flow through the circuit branch containing diode D1 and ESD protection circuit 16, current path 52 demonstrates that current flows instead through diode D2, again protecting power amplifier output transistor M4 from damage. Because diode D2 gives negative ESD strike protection on power amplifier output terminal $PA_{OUT}$ relative to the negative voltage supply terminal $V_{SS}$, the diode D2 effectively operates to give the output ESD cell 18 bi-directional ESD protection, while not substantially increasing the capacitance of output ESD cell 18 that was lowered by the addition of diode D1.

As previously described, in accordance with an aspect of the invention, it is desirable to protect the power amplifier output transistor M4 from damage in the course of a variety of different types of ESD events that can occur on power amplifier output terminal $PA_{OUT}$. As such, it is important to protect power amplifier output transistor M4 from damage resulting from an ESD strike on power amplifier output terminal $PA_{OUT}$ relative to the positive voltage supply terminal $V_{DD}$, in addition to ESD strikes relative to the negative voltage supply terminal $V_{SS}$.

Figure 3:
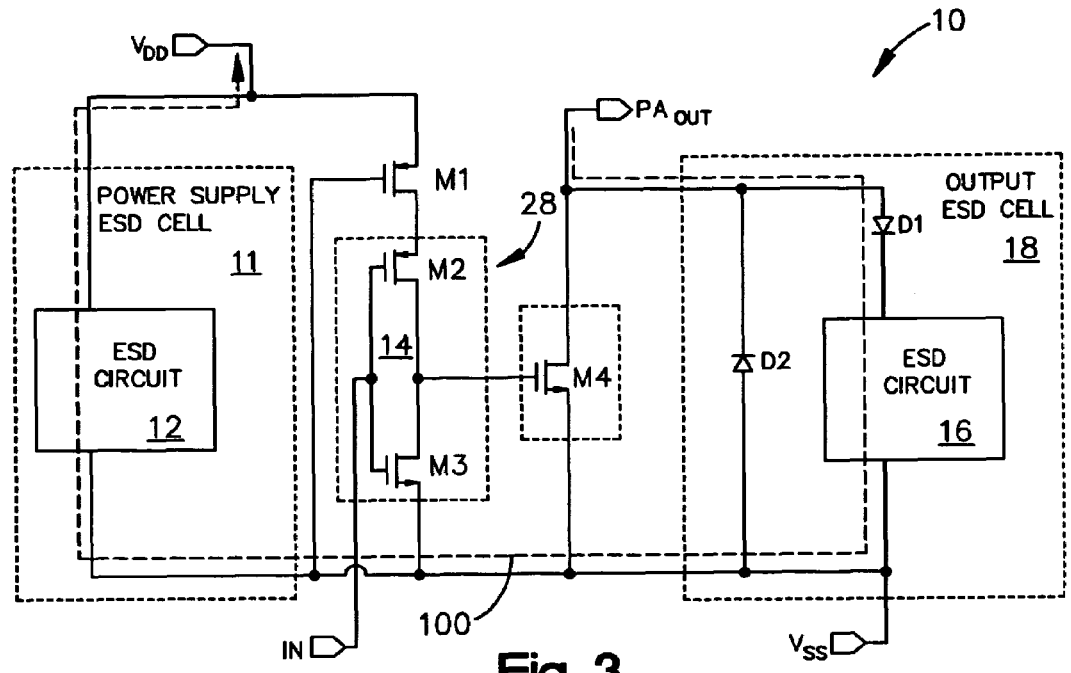
FIG. 3 illustrates a schematic diagram of a power amplifier circuit that depicts a current flow associated with another ESD event in accordance with an aspect of the invention.

FIG. 3 illustrates a current path 100 in the course of a positive ESD strike on power amplifier output terminal $PA_{OUT}$ relative to the positive voltage supply terminal $V_{DD}$. Current flows through the low impedance path of the series connection of the diode D1 and the ESD protection circuit 16. The current continues to flow through the power supply ESD cell, containing ESD protection circuit 12, and is shunted to the positive voltage supply terminal $V_{DD}$, thus protecting power amplifier output transistor M4 from damage.

Figure 4:
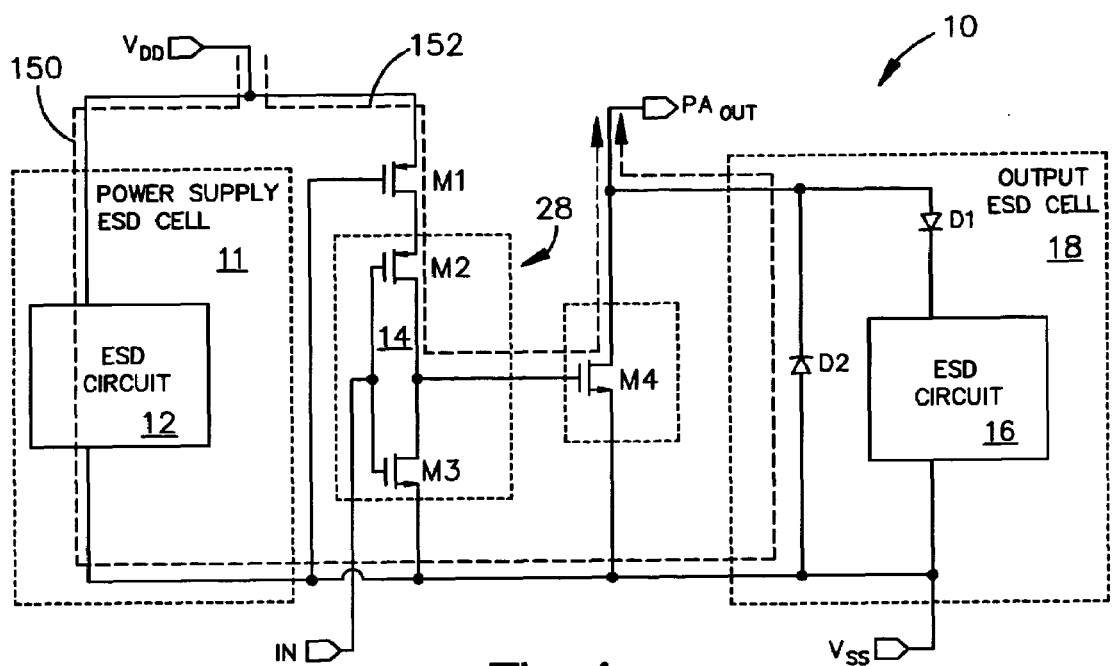
FIG. 4 illustrates a schematic diagram of a power amplifier circuit that depicts current flows associated with yet another ESD event in accordance with an aspect of the invention.

FIG. 4 illustrates current paths 150 and 152 in the course of a negative ESD strike on power amplifier output terminal $PA_{OUT}$ relative to the positive voltage supply terminal $V_{DD}$. The current path 150 is shown as current flow in a direction opposite current path 100 illustrated in FIG. 3, with the exception that current flows through the diode D2 as opposed to the series connection of the diode D1 and the ESD protection circuit 16 for the reasons previously described. However, current also flows through current path 152 in the event of a negative ESD strike on power amplifier output terminal $PA_{OUT}$ relative to the positive voltage supply terminal $V_{DD}$. The current through the current path 152 flows through the gate of the power output transistor M4 to the power amplifier output terminal $PA_{OUT}$, resulting in damage to the gate oxide of the power output transistor M4. Therefore, it is desirable to minimize the current through the current path 152 and maximize the current through the current path 150.

As demonstrated in FIG. 4, current path 152 encompasses transistors M1, M2, and particularly M4, which is the transistor sought to be protected in accordance with an aspect of the invention. If the voltage difference between the gate and drain terminals of transistor M4 is sufficiently high, the current traveling through transistor M4 will damage the transistor, thus preventing proper functioning of the power amplifier circuit 10. To properly protect against damage to transistor M4, despite a certain amount of current traveling through it, transistor M1 is operative to increase the impedance of current path 152. As described above, transistor M1 is shown to be PMOS field-effect transistor with a gate terminal connected to the negative power supply terminal $V_{SS}$, such that it operates in the normal bias condition. However, it should be noted that any type of circuit device or combination of devices could be substituted for transistor M1, such as a different kind of transistor operating in a normal bias condition, so long as the circuit device increases impedance in the current path 152, without adversely affecting the operation of the power amplifier circuit 10.

By increasing the impedance of current path 152, transistor M1 operates to reduce the current flowing through current path 152 to an acceptable amount without damaging the gate oxide of the transistor M4. As a result, more current is directed through the current path 150, which safely flows through the power supply ESD cell 11 and through the diode D2, thus avoiding transistor M4 and being shunted to power amplifier output terminal $PA_{OUT}$. The transistor M1 is therefore effective in protecting transistor M4 from negative ESD strikes on power amplifier output terminal $PA_{OUT}$ relative to the positive voltage supply terminal $V_{DD}$. The combination of the circuit devices, including transistor M1, diode D1, and diode D2, provide ESD protection from a variety of types of ESD strikes on power amplifier output terminal $PA_{OUT}$, as well as providing a low capacitance output ESD cell for maximum RF power transfer.

The above description of the ESD protection of transistor M4 has been solely under the context of a power amplifier circuit, such as that which could be used in a transmitter. However, this ESD protection capability could be used in a variety of different circuit devices requiring positive and negative ESD protection of a transistor. For example, a receiver can include a low noise amplifier (LNA) with an input transistor also including a cascade transistor to increase impedance. The ESD protection scheme can be employed to protect the gate oxide of the input transistor of the LNA. Alternatively, the ESD protection scheme can be employed on a transceiver which could have a power amplifier output terminal that is also operative as an input terminal to a LNA of a receiver in accordance with an aspect of the invention.

Figure 5:
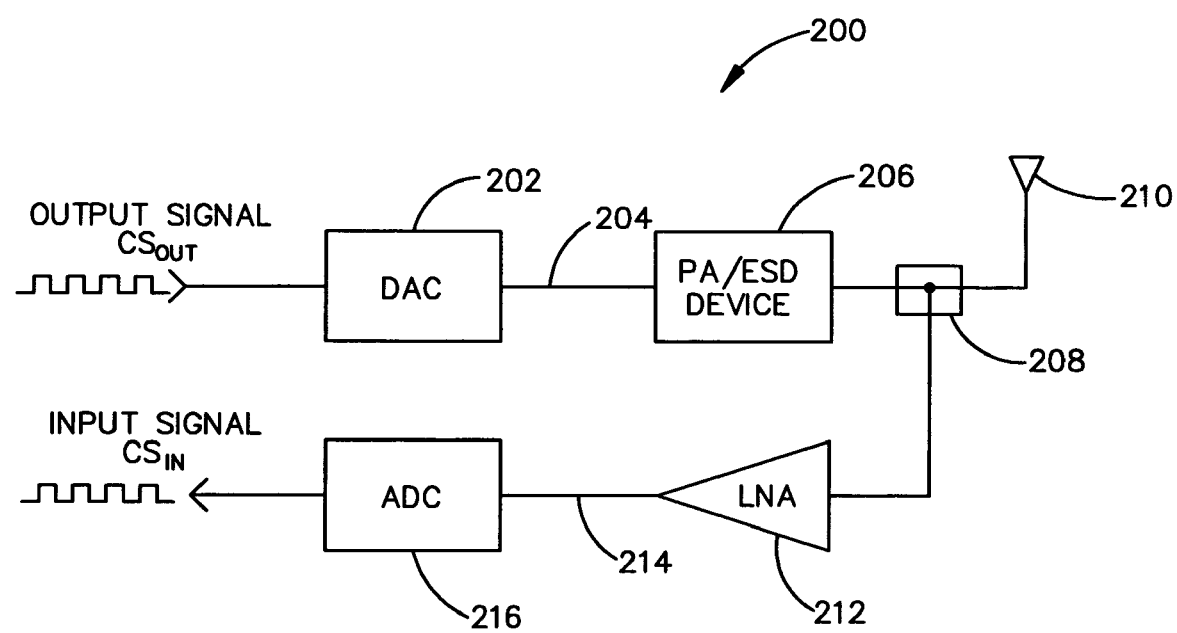
FIG. 5 illustrates a block diagram of a transceiver containing the power amplifier circuit with full ESD protection in accordance with an aspect of the invention.

FIG. 5 illustrates a transceiver 200 in accordance with an aspect of the present invention. The transceiver 200 includes a digital-to-analog converter (DAC) 202 which converts a digital RF output signal $CS_{OUT}$ to an analog RF signal 204. The analog RF signal 204 is provided to a power amplifier 206 with ESD protection, such as that illustrated in FIGS. 1-4. The power amplifier 206 provides an amplified output signal that is transmitted via an antenna 210. An output terminal of the power amplifier and an input terminal of a low noise amplifier (LNA) 212 are coupled to an input/output (10) terminal 208. The I/O terminal 208 can include a switch that selects between transmitting and receiving of RF signals. For a received signal, an RF analog signal is provided to the LNA 212 via the antenna 210. The RF analog signal is then amplified by the LNA 212 to provide an amplified RF analog signal 214. The amplified RF analog signal 214 is then provided to analog-to-digital converter (ADC) 216 for analog to digital conversion. A digital input signal $CS_{IN}$ is subsequently output from ADC 216.

The ESD protection of the power amplifier 206 is operative to protect both the power amplifier 206 and the LNA 212 from both positive and negative ESD strikes, relative to either positive or negative supply voltage that may occur on the shared IO terminal 208. Additionally, the ESD protection circuitry is designed to meet both the output requirements of the power amplifier 206 and the input requirements of the LNA 212. The ESD protection of the power amplifier 206 allows for a smaller, integral electronic package that protects circuit devices from ESD strikes without adversely interfering with proper circuit functionality.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. An electrostatic discharge (ESD) device for protecting a power amplifier circuit, the device comprising:
   a first ESD protection circuit coupled between a positive terminal of a supply voltage and a negative terminal of the supply voltage;
   a second ESD protection circuit coupled between the negative terminal of the supply voltage and an output terminal of the power amplifier circuit, wherein a first current path is formed from the positive terminal to the output terminal through the first and second ESD protection circuits;
   a drive circuit coupled to the power amplifier circuit; and
   a circuit device, coupled between the positive terminal of the supply voltage and a supply terminal of the drive circuit, operative to increase impedance of a second current path from the positive terminal to the output terminal through the power amplifier circuit to divert current from the second current path to the first current path in the course of an ESD event.

2. The ESD device of claim 1, wherein the circuit device substantially reduces current flow through the second current path in the course of a negative ESD strike on the output terminal of the power amplifier circuit relative to the positive terminal of the supply voltage.

3. The ESD device of claim 1, wherein the circuit device is a field effect transistor operating in a bias condition that is coupled between the positive terminal of the supply voltage and a gate of a power amplifier output transistor.

4. The ESD device of claim 1, further comprising a diode connected in series with the second ESD protection circuit, the diode reducing the capacitance associated with the second ESD protection circuit.

5. The ESD device of claim 4, wherein current flows through both the diode and the second ESD protection circuit in the course of a positive ESD strike on the output terminal of the power amplifier circuit relative to the negative terminal of the supply voltage.

6. The ESD device of claim 4, wherein current flows through the diode, through the second ESD protection circuit, and through the first ESD protection circuit in the course of a positive ESD strike on the output terminal of the power amplifier circuit relative to the positive terminal of the supply voltage.

7. The ESD device of claim 1, further comprising a diode arranged parallel to the second ESD protection circuit.

8. The ESD device of claim 7, wherein current flows through the diode in the course of a negative ESD strike on the output terminal of the power amplifier circuit relative to the negative terminal of the supply voltage.

9. A receiver comprising the ESD device of claim 1.

10. A transceiver comprising the ESD device of claim 1, wherein the output terminal of the power amplifier circuit is also an input terminal of a low noise amplifier.

11. A power amplifier circuit comprising:
   a power amplifier output transistor;
   a drive circuit coupled to the power amplifier transistor;
   a first electrostatic discharge (ESD) protection circuit coupled between a positive terminal of a supply voltage and a negative terminal of the supply voltage;
   a first diode;
   a second ESD protection circuit coupled to the first diode, the first diode and the second ESD protection circuit coupled between the negative terminal of the supply voltage and an output terminal of the power amplifier output transistor to provide a first current path from the output terminal to the negative terminal, wherein the first diode reduces the capacitance associated with the second ESD protection circuit;
   a second diode coupled between the output terminal and the negative terminal, the second diode providing a second current path from the negative terminal to the output; and
   a circuit device, coupled between the positive terminal of the supply voltage and a supply terminal of the drive circuit, operable to increase impedance.

12. The circuit of claim 11, wherein the circuit device comprises an ON transistor coupled between the positive terminal of the supply voltage and a gate of the power amplifier output transistor, wherein the transistor increases the impedance of a third current path from the positive terminal of the supply voltage to the output terminal through the gate of the power amplifier output transistor.

13. The circuit of claim 12, wherein the transistor is operative to divert current, in the course of a negative ESD strike on the output terminal relative to the positive terminal, from the third current path to a fourth current path from the positive terminal to the output terminal through the first ESD protection circuit and the second diode due to the increased impedance of the third current path.

14. The circuit of claim 12, wherein the ON transistor is coupled between a second transistor and the positive terminal, the second transistor and a third transistor comprising the drive circuit for providing an input signal to the power amplifier output transistor.

15. The circuit of claim 11, wherein current flows through the first current path in the course of a positive ESD strike on the output terminal of the power amplifier circuit relative to the negative terminal of the supply voltage and current flows through the first current path and the first ESD protection circuit to the positive terminal in the course of a positive ESD strike on the output terminal relative to the positive terminal.

16. The circuit of claim 11, wherein current flows through the second current path in the course of a negative ESD strike on the output terminal relative to the negative terminal.

17. A receiver comprising the circuit of claim 11.

18. A transceiver comprising the circuit of claim 11, wherein the output terminal of the power amplifier output transistor is also an input terminal of a low noise amplifier.

19. A communication device comprising:

means for amplifying an input signal;

means for driving the input signal amplifier;

a first means for providing bi-directional electrostatic discharge (ESD) protection of the means for amplifying between a positive terminal of a supply voltage and a negative terminal of the supply voltage;

a second means for providing bi-directional ESD protection of the means for amplifying between the negative terminal of the supply voltage and an output terminal of the means for amplifying;

means for reducing the output capacitance of the second means for providing bi-directional ESD protection; and means for increasing the impedance of a current path from the positive terminal to the output terminal through the means for driving to substantially limit current flow through the means for amplifying in the course of an ESD event.

20. The device of claim 19, wherein the ESD event is a negative ESD strike on the output terminal relative to the positive terminal.

21. The device of claim 19, further comprising means for amplifying a received signal having an input terminal coupled to the output terminal of the means for amplifying an input signal.

22. The device of claim 19, wherein the means for increasing the impedance of a current path from the positive terminal to the output terminal substantially limits current flow through the means for amplifying by diverting current through the first and second means for providing bi-directional ESD protection.

* * * * *